United States Patent [19]

Brinkhaus

[11] Patent Number: 5,584,063
[45] Date of Patent: Dec. 10, 1996

[54] IF FILTER ARRANGEMENT FOR FM RECEPTION SIGNALS

[75] Inventor: Stefan Brinkhaus, Remchingen, Germany

[73] Assignee: Becker GmbH., Germany

[21] Appl. No.: 403,919

[22] PCT Filed: Jul. 21, 1994

[86] PCT No.: PCT/DE94/00842

§ 371 Date: Aug. 17, 1995

§ 102(e) Date: Aug. 17, 1995

[87] PCT Pub. No.: WO95/03650

PCT Pub. Date: Feb. 2, 1995

[30] Foreign Application Priority Data

Jul. 22, 1993 [DE] Germany .............. 43 24 603.6

[51] Int. Cl.$^6$ .................................................. H04B 1/06
[52] U.S. Cl. .................. 455/266; 455/306; 455/307; 455/339
[58] Field of Search ............................ 455/266, 295, 455/296, 303, 304, 306, 307, 312, 337, 338, 339, 340

[56] References Cited

U.S. PATENT DOCUMENTS

| | | | |
|---|---|---|---|
| 3,991,419 | 11/1976 | Thomas | 343/206 |
| 4,403,351 | 9/1983 | Karabinis | 455/304 |
| 4,501,004 | 2/1985 | Yoshida et al. | 375/102 |
| 4,797,950 | 1/1989 | Rilling | 455/276 |
| 4,816,770 | 3/1989 | Naumann | 329/122 |
| 4,926,499 | 5/1990 | Kobayashi et al. | 455/306 |
| 5,034,695 | 7/1991 | Owen | 329/325 |
| 5,159,709 | 10/1992 | Hansen | 455/266 |
| 5,307,517 | 4/1994 | Rich | 455/306 |

FOREIGN PATENT DOCUMENTS

| | | |
|---|---|---|
| 05029979 | 2/1993 | Japan . |
| 2162007 | 1/1986 | United Kingdom . |
| 9100655 | 1/1991 | WIPO . |
| 9116767 | 10/1991 | WIPO . |

*Primary Examiner*—Andrew Faile
*Assistant Examiner*—Lee Nguyen
*Attorney, Agent, or Firm*—Westman, Champlin & Kelly, P.A.

[57] ABSTRACT

The invention concerns an I.F. filter arrangement in a receiver for receiving FM signals. An I.F. filter arrangement is to be provided which no longer contains the disadvantageous effects of a control loop from which a control value is extracted from the MPX signal to be used for tracking the I.F. filter. The solution according to the invention is an I.F. filter arrangement having a filter device which comprises a defined, in particular, a fixed adjusted bandpass region and at least two outputs having center frequencies staggered with respect to one another or I.F. frequencies staggered with respect to one another at the same center frequency. The signals from the outputs are fed to a weighting device which is regulated by a control value extracted from the demodulated FM signal.

17 Claims, 6 Drawing Sheets

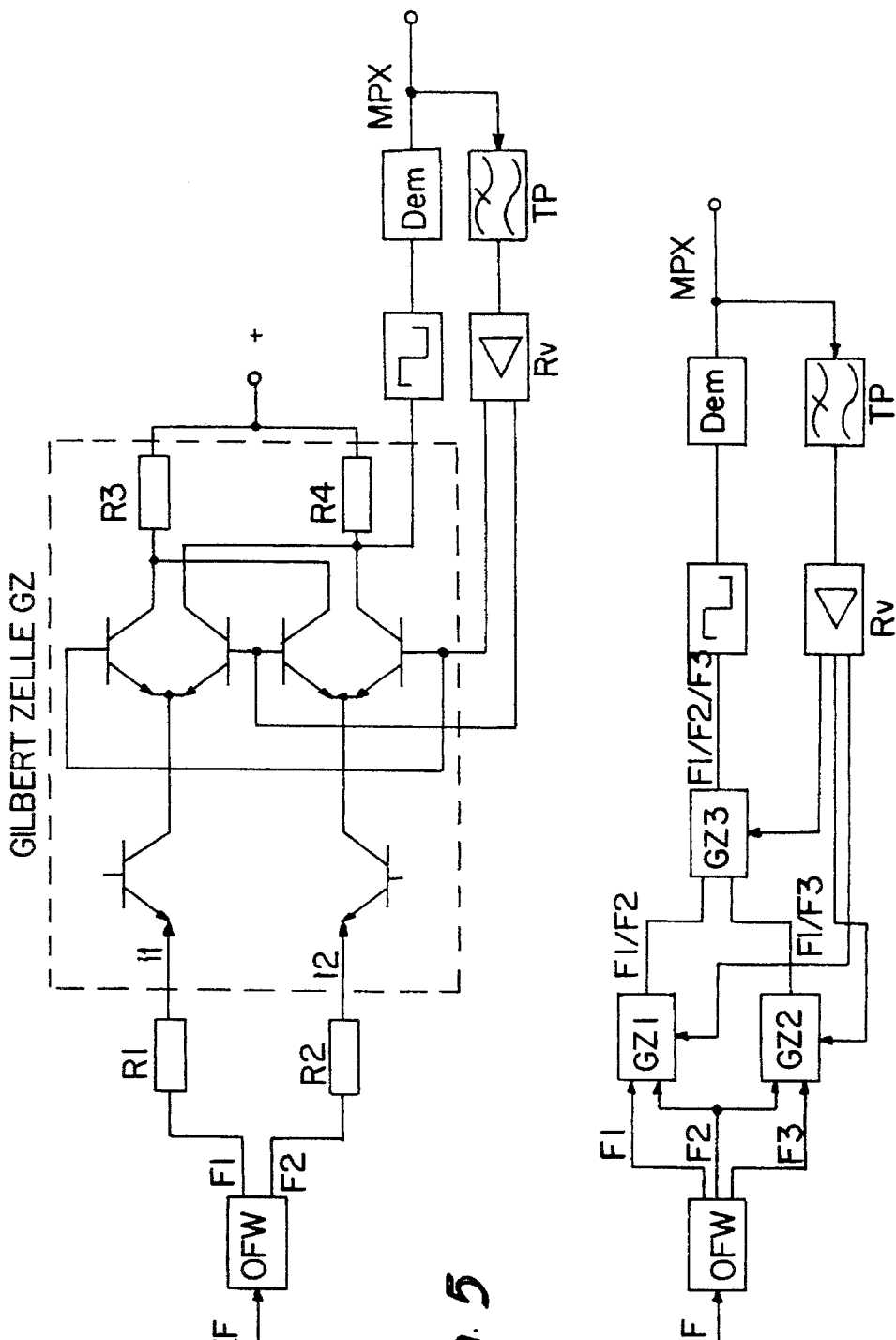

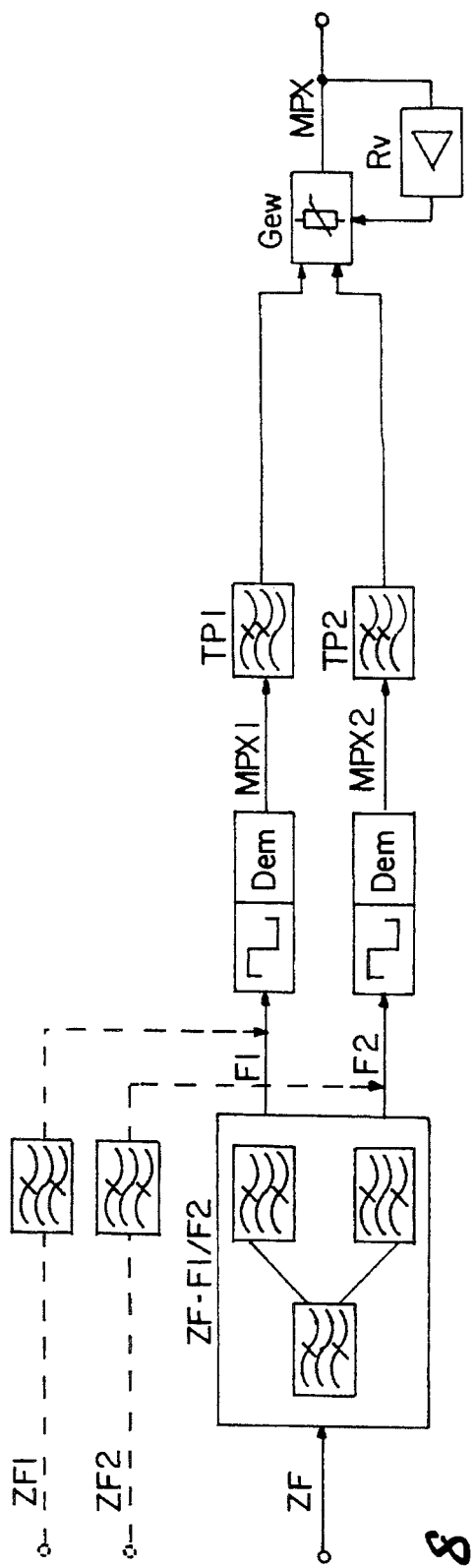
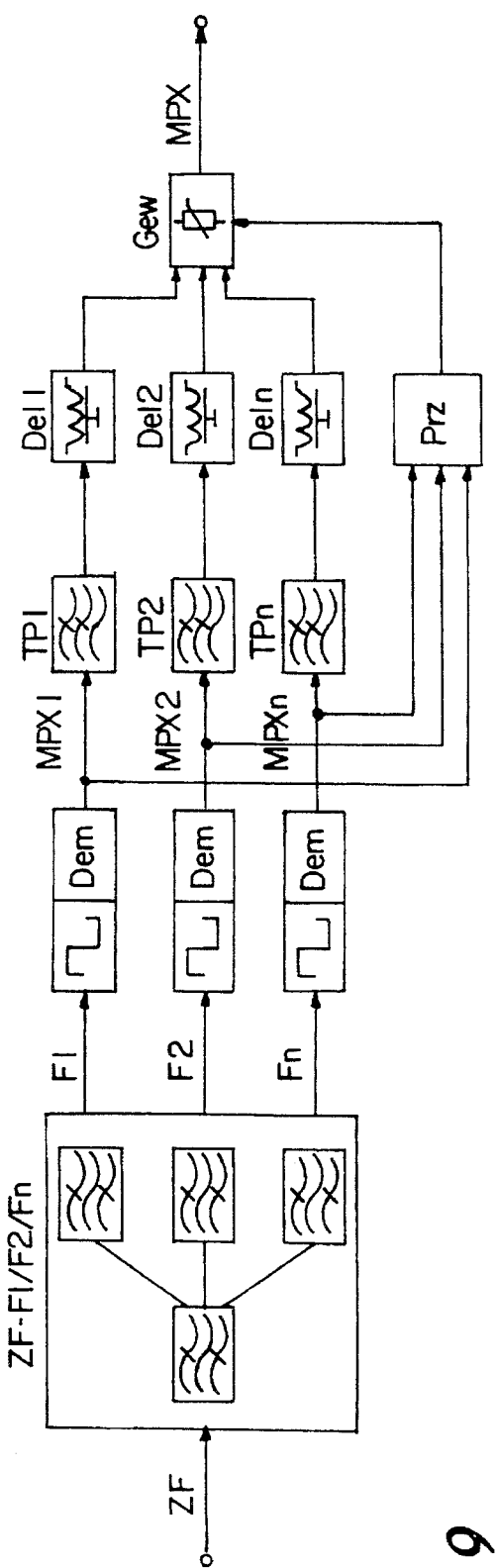
Fig. 8
Fig. 9

IF FILTER ARRANGEMENT FOR FM RECEPTION SIGNALS

BACKGROUND OF THE INVENTION

The invention relates to an I.F. filter arrangement for FM receiving signals.

An I.F. filter arrangement having a narrow band I.F. filter with varying centre frequencies is known from WO 88/08223, equivalent to EP 0 358 649.

The I.F. filter is disposed between the tuner and the demodulator and its centre frequency can be tracked dependent on the demodulated FM signal by means of capacitative diodes.

The desired advantage which this device should offer as opposed to conventional fixed filters is, on the one hand, a significantly increased selection with respect to neighbouring channel interferences and, on the other hand, a measurable improvement of the signal-to-noise ratio as a result of the considerable reduced bandwidth and the deviation tracking therefore applied.

These improvements are only seen in the statistical operation at sufficient field strengths and low deviation.

At high deviation, the Klirr factor in the demodulated FM signal rises very intensely up to unacceptable values.

A further disadvantage of this arrangement is seen when impulse-like disturbances or quick modulation shifts occur. This I.F. filter arrangement can then get out of control so much so that dramatic impulse disturbances become noticeable. In audio receivers having such a circuit, these disturbances are recognized as aggressive scratchings.

SUMMARY OF THE INVENTION the task of the invention is therefore to achieve an I.F. filter arrangement having a substantially comparable filter performance but which shows a significantly reduced sensitivity to interference especially with respect to impulse-like interferences or quick modulation shifts.

This task is achieved by an I.F. filter arrangement having the features set out in claim 1 and by a method for carrying out I.F. filtering having the features set out in method claim 17. Advantageous further embodiments of the invention are represented in the dependent claims.

According to the known I.F. filter arrangement at low field strengths and strong neighbouring channel interferences very narrow band filters are necessary which are tracked by means of a control loop.

In accordance with the invention, regulation of the tracked filters is not carried out and therefore goes against the teaching of the state of the art. According to the invention, the necessary regulation does not take place by way of the filters which are to be tracked, but rather the output signals of a non-tracked filters unit having defined passbands are connected or mixed in a weighted relationship with one another.

According to the invention, the I.F. filter arrangement is shown having two or more filters with staggered centre frequencies, whose manner of operation is explained in the following.

The frequencies having passed through their respective filter appear simultaneously at the output of these filters and with the correct phase whereby it was unnecessary to force any appropriate phase compensation. A weighting operation, switched on at a later stage, selects the respective optimal filter corresponding to the instantaneous modulation frequency and puts together a resulting passband curve which fits the respective filter.

As a result, an optimized passband curve may be formed with no phase error and practically no time lag. A control loop formed with this arrangement is around a few magnitudes faster than when using a tracked filter and no longer comprises the disadvantages mentioned above.

According to the invention, two or more filters having the same center frequency but staggered I.F. frequencies can also be used. In this way, signals at the filter outputs are individually demodulated and only then are the demodulated FM signals combined to a resultant signal by way of a weighting operation. This construction, while overcoming the mentioned disadvantages, allows the use of the same type of filters which are more favourable from a cost point of view and are easy to employ.

Preferably, the output signals of the FM demodulators are fed to the weighting device via a respective low pass filter. As a result, a very fast control is presented when the weighted FM signal from the output of the weighting device is fed back to the weighting device as a regulating variable via a feedback amplifier. This fast operating embodiment of the invention guarantees a filtering having particularly little interference.

As an alternative to the fixed adjusted filters preferably, filters are used which during the manufacturing process can be adjusted to the requirements of a specific device without requiring an individual type of filter for each type of device whereby in this connection, individual differences of the filters due to component variations can also be compensated for and, as a result, allows devices to be produced which, over all, are free as best as possible from any interference.

In accordance with the method of the present invention, the plurality of output signals of a filter device having defined passband regions are coupled with one another via a weighting device. Here, the weighting operation is controlled or regulated by demodulated FM signals. The output signals of the filter device having the defined passband regions comprise either center frequencies staggered with respect to one another or they show staggered I.F. frequencies with respect to one another at the same center frequency. Due to the method of the invention having regulation of the weighting of the output signals of the filter device from non-tracked filters, then the above-mentioned disadvantageous are overcome.

Without the invention been limited thereto, further examples of embodiments of the invention are explained with the help of FIGS. 2 to 9.

BRIEF DESCRIPTION OF THE DRAWINGS

FIG. 5 shows an embodiment of the weighting device shown as a Gilbert cell Gz in the I.F. filter arrangement, FIG. 6 shows an embodiment of the I.F. filter arrangement according to FIG. 2 having three outputs with three center frequencies staggered with respect to one another, FIG. 8 shows another embodiment of the I.F. filter arrangement according to the invention having a demodulator Dem and a low pass filter Tp for each output signal, and FIG. 9 shows a I.F. filter arrangement according to FIG. 8 having a plurality of varying output signals and having another realisation of the weighting device by means of a processor which contains the demodulated FM signal previous to the weighting device.

DETAILED DESCRIPTION OF THE PREFERRED EMBODIMENTS

Figure 1:
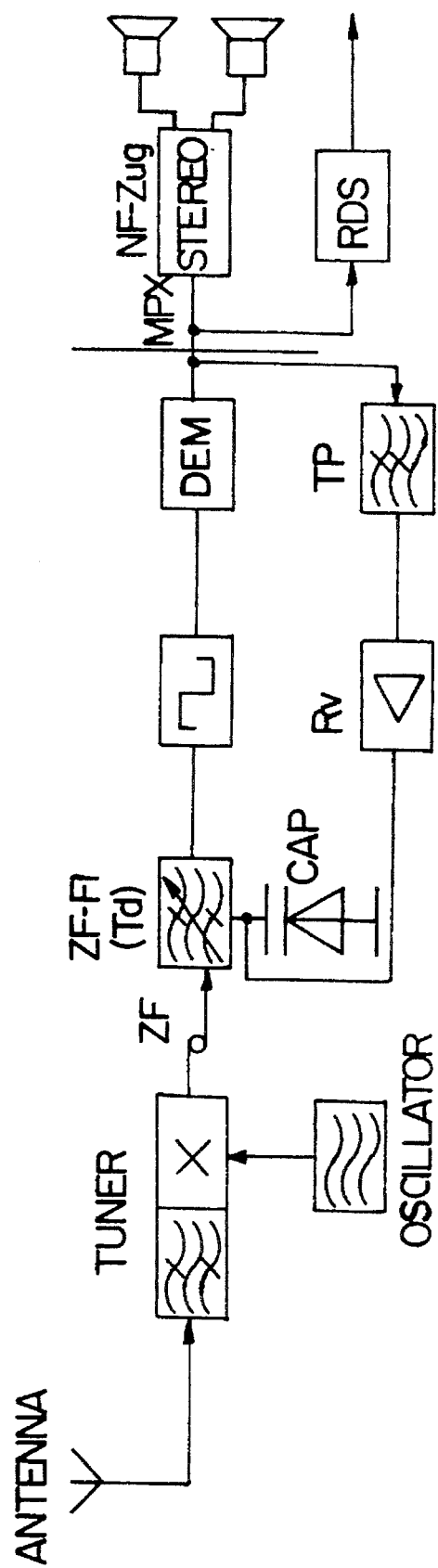
FIG. 1 shows a block diagram of the known I.F. filter arrangement.

FIG. 1 shows a block diagram of an FM receiver containing the known I.F. filter arrangement of WO 88/08223. In this FM receiver, the I.F. signal is generated by known components from the signal received by the antenna. At the output of the demodulator Dem, the demodulated FM multiplex signal MPX is made available from which a NF-mono or a stereo signal, as well as, RDS data are extracted.

With the known I.F. filter arrangement, the I.F. signal is fed to an I.F.-filter ZF-Fi with a significantly lower bandpass width compared to a normal I.F.-filter and the center frequency of the I.F. signal can be tracked with capacitative diodes Cap. The I.F. signal passes through this narrow band filter with a considerable delay time Td.

In the demodulator Dem, the FM signal is demodulated and is made available for further processing as a multiplex signal MPX. The tuning voltage of the capacitative diodes Cap is re-adjusted in a control loop via the low pass filter TP and the regulating amplifier RV, in order to track the resonance frequency of the narrow band filter BP to the instantaneous position of the I.F. frequency.

Due to the considerable delay time Td then when impulse-like interferences occur, the filter BP can be fully thrown out from the tracking region since the control loop is locked out and requires considerable time before it is locked in again. The acoustic interference impression is an uninterrupted receiving of very unpleasant loud cracking and clapping which through the narrow band filter contains very little noise.

When the type of receiver concerns a satellite TV receiver, then, as opposed to the conventional receiver, interferences occur in the video signal as soon as there is a substantially low input level at the antenna. These disturbances appear at first on the screen as black and white lines (identified in the technical language as spikes or fishes).

Figure 2:
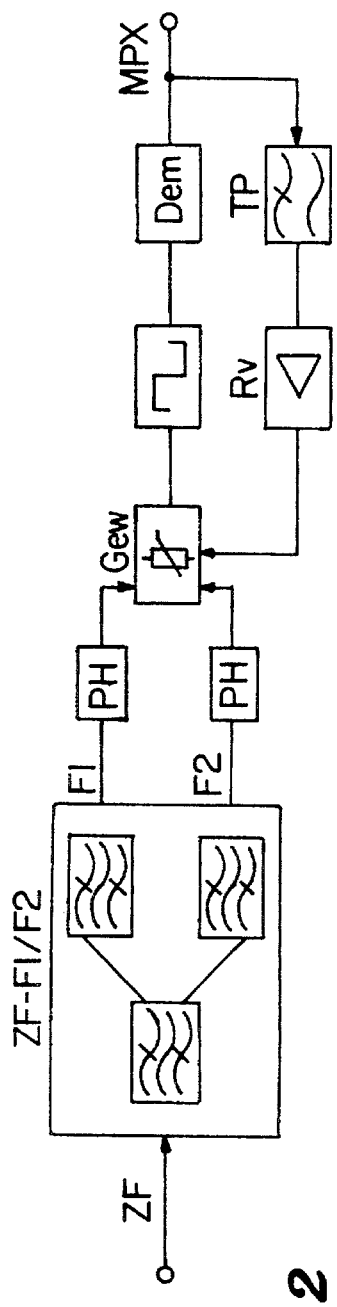
FIG. 2 shows a block diagram of an embodiment of an I.F. filter arrangement according to the invention.

FIG. 2 shows an embodiment of an I.F. filter arrangement in accordance with the invention. The I.F. filter IF-F1/F2 has two outputs comprising center frequencies F1 and F2 staggered with respect to one another and which are fed to the weighting device Gew. The weighting device sums the outputs signals F1 and F2 with variant weights and then feeds the signals to an FM demodulator Dem. The demodulated FM signal output from the FM demodulator is fed back in a control loop to the weighting device Gew for regulating the weighting. The weighting of the individual signals fed back to the weighting device is changed dependent on the demodulated FM signal. As a result of altering the weighting, an effect is achieved which corresponds with the effect of tracking an LC filter whereby, however, according to the invention the disadvantage of the delay time of the I.F. filter for a control loop is no longer present since the control loop does not regulate the filter but rather comes into effect only after the filtering stage. Furthermore, as opposed to dynamically changing filters, defined filters can be used which as well as being realizable from a manufacturing point a view are also more favourable in price and, as well, substantially more stable with temperature.

A low pass filter Tp and also a regulating amplifier may be provided in the control loop. Both components may already be realized through the demodulator Dem. Here, the low pass filter Tp only guarantees that it is only the lowest lying spectral signal which is employed as the reference value for the regulation which this realization substantially makes easier to achieve. In as much as the selected or tapped demodulated FM signal does not have a sufficient signal strength for the weighting device, the regulating amplifier Rv should strengthen or dampen the signal to the necessary value so that a weighting is given which is always certain and distinctly defined.

Preferably, phase correcting devices are provided along with the non-compulsory low pass filter Tp and the regulating amplifier Rv and are disposed at the inputs of the weighting device associated with the filter device by means of which phase correct coupling is ensured. As a result, non-linear effects at the coupling stage are prevented which are caused by phase differences of the individual output signals of the filter device.

Figure 4:
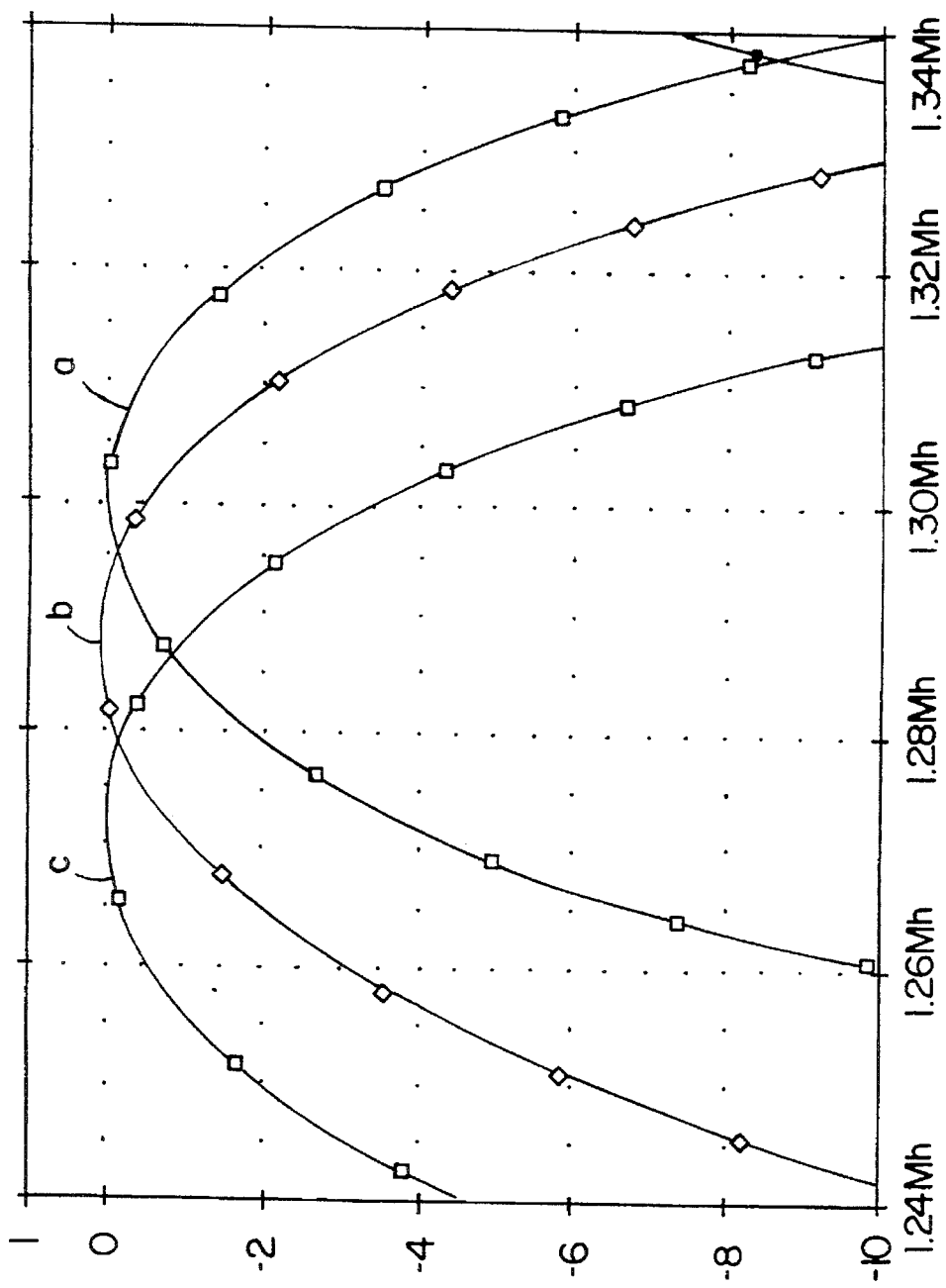
FIG. 4 shows bandpass curves of an I.F. filter arrangement according to FIG. 2.

FIG. 4 shows the bandpass curves of the I.F. filter arrangement according to FIG. 2 for three different weightings, namely;

| | | | | | |
|---|---|---|---|---|---|
| 1. | F1 | 100% | F2 | 0% | (curve a) |
| 2. | F1 | 50% | F2 | 50% | (curve b) |
| 3. | F1 | 0% | F2 | 100% | (curve c) |

Due to such a type of coupling, as well as preventing the unpleasant interference effects, the invention also succeeds in additionally improving the signal-to-noise ratio.

Figure 3:
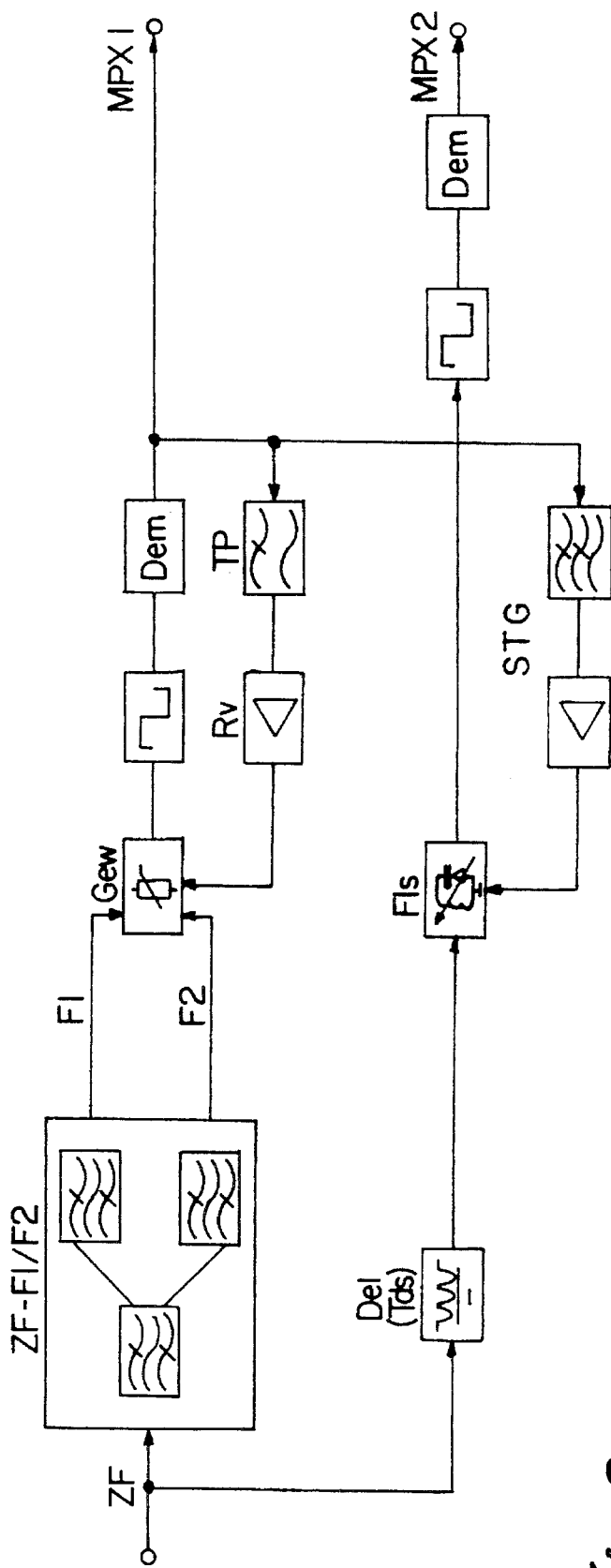
FIG. 3 shows a deviation of the I.F. filter arrangement according to FIG. 2 having an additional I.F. network.

FIG. 3 shows an embodiment of an I.F. filter arrangement according to the invention which apart from having the already mentioned advantages allows a further increase in the selection, at least to the values of a tracked filter, and as a result, reaches a significant higher limit-frequency. The embodiment according to FIG. 3 has the I.F. filter arrangement of FIG. 2 with a further I.F. network including a demodulator switched in parallel with the output MPX2 and which contains an I.F.-filter Fis with a trackable center frequency. In this way, the tracking is not carried out as a control loop which employs its own demodulated FM signal MPX2, but instead the tracking is controlled by the demodulated FM signal MPX1 extracted at an earlier stage. A particularly special feature is the provision of a delay device Del with a delay time Tds which is chosen to correspond to the sum of all the delay times in this tracking arrangement; what is decisive here are the time delays in the filter I.F.-F1/F2, the demodulator Dem and the phase shift in low pass filter of the control device Stg. As a result, in contrast to the known I.F. filter arrangement, here the tracking is carried out with a correct phase for the position of the instantaneous I.F. frequency.

The advantage that this embodiment offers with respect to the known I.F. filter arrangement is that, after each optimization, on the one hand, a higher limit-frequency of the multiplex signal (higher channel separation of the stereo signal and a less interfered RDS receiving) and/or, on the other hand, a greater selection with mono receiving and therefore a better noise to signal ratio (long-distance receiver).

With respect to the form of the invention according to FIG. 2, the advantage is seen for the same limit-frequency in a higher selection and a further improvement in the noise-to-signal ratio.

FIG. 5 shows an I.F. filter arrangement corresponding to FIG. 2 for a TV satellite receiver. The I.F. frequency of this receiver prior to the FM demodulator lies at 480 MHz. Here, surface filters OFW have been tried. A bipolar mixer serves as the weighting device. Such a device is known in the literature as a four Quadrant multiplier or Gilbert cell and therefore is only shown schematically without any D.C. current paths. A special feature is represented however in the coupling together of the two filter outputs. In contrast to the Gilbert cell where the input a.c. current i1 and i2 are coupled together as identical signals but with a 180 degree rotated phase position, here, the currents are independent from one another and are a respective function of the outputs F1 and F2 and are summed (weighted) independent from the output voltage of the regulating amplifier RV (at the resistances R3 and R4).

FIG. 6 shows a further development of the I.F. filter arrangement of the invention according to FIGS. 2 or 5. This I.F. filter device contains three outputs having three center frequencies F1, F2 and F3 staggered with respect to one another. By increasing the number of outputs of the I.F. filter arrangement with corresponding cascading of the weighting devices which are realized here as a Gilbert cell, then practically every filter curve, corresponding to the existing receiver conditions and receiver priorities, can be achieved. In this way, the extreme values of the resultant filter curves are limited by the filter outputs at the frequency which is the furthest away from the center frequency, which leads to a corresponding number and corresponding cascading.

A further possibility having the same effect as the cascading arrangement is given by a parallel arrangement of the weighting devices having a final summing-up stage.

The I.F. filter arrangements corresponding to FIGS. 2 to 6 can be used for analog FM receivers. As an I.F. filter one can consider conventional LC filters, as well, as resonator filters or surface wave filters, for example, having a ceramic or quartz substrate. It has proven much more flexible, however, to chose a digital switch as from the I.F. level. On the other hand, for fast control loops, the arrangements corresponding to FIGS. 2 to 6 appear to be more appropriate since here, in the same way as with the analog filters, digital filters having constant filter functions which only change slowly may be used which are less suitable for extremely fast tracking.

Figure 7:
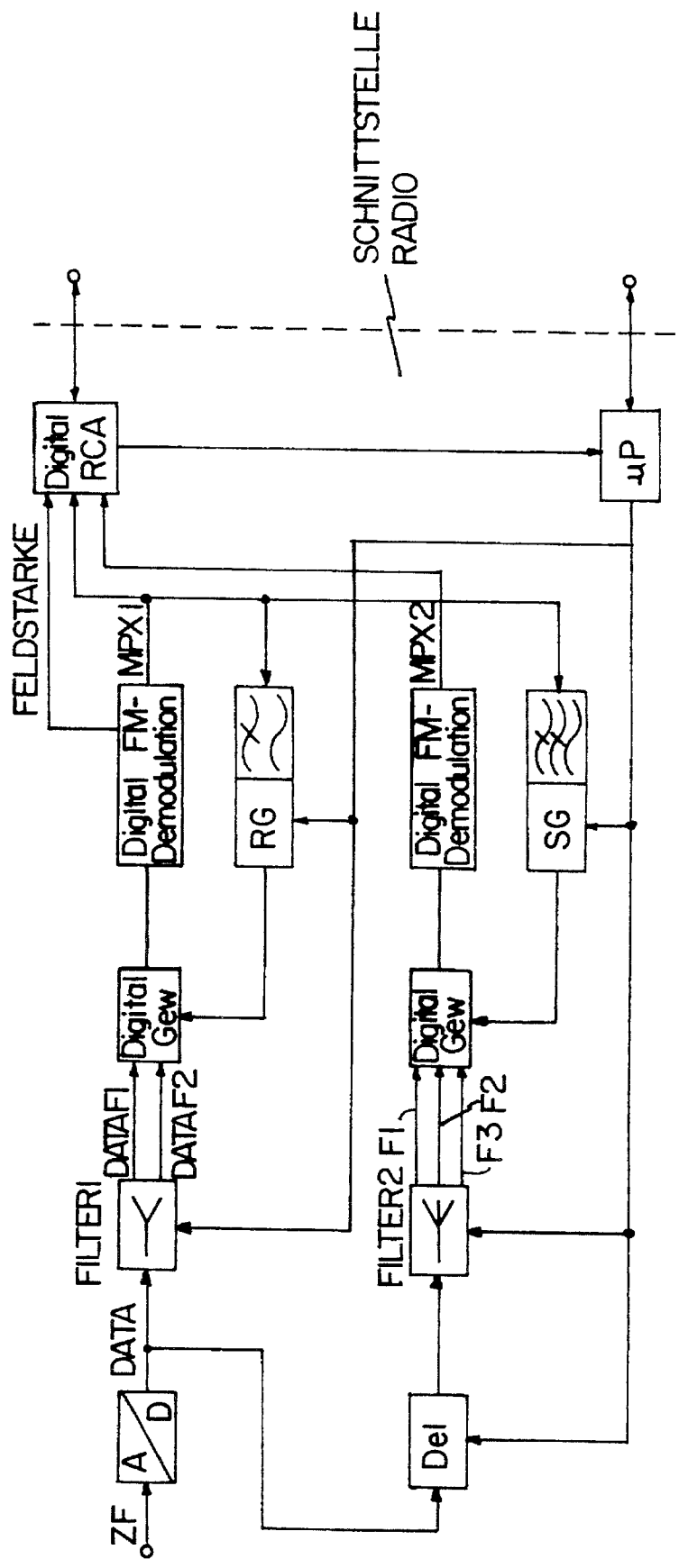
FIG. 7 shows an embodiment of a digitized FM receiver in the I.F. level having an I.F. filter arrangement similar to FIG. 3.

FIG. 7 shows the principal diagram of a digitized FM receiver as from the I.F. level which corresponds to the principal diagram shown in FIG. 3. This system is far more flexible as opposed to the analog solution having, for example, fixed filter characteristics which is all cases are selected in the production process. Regarding an evaluation of the receiving status of the receiver condition analyser component RCA, all filter parameters corresponding to the receiving situation may be pre-adjusted via a corresponding control processor, the delay time of the delay device Del corresponding to the actual filter adjustments may be selected, and the control loop of the weighting operation of filter 1 and the control net of the weighting operation of filter 2 may be optimized.

A technically simple solution is shown in FIG. 8. The outputs F1 and F2 of the filter device I.F.-F1/F2 are fed to two parallel FM demodulators Dem and low pass filters Tp. Alternatively, two identical filters having the same center frequencies but staggered I.F. input frequencies could also be connected to the two FM demodulators. The alternatives are indicated with dashed lines. The two low pass filters Tp are identically constructed and therefore have the same phase at their outputs, their limit-frequency can therefore be tracked to the useful signal and filter out a large part of the interference amplitudes. Moreover, low pass filters Tp are far less expensive to realise then delay devices. The final weighting operation by way of the weighting device Gew is carried out practically free of any delay in a control loop taken from the MPX output. As a result, the weighting operation is determined substantially only from the useful signal. The represented regulating amplifier Rv guarantees, in as much as the signal strengths allow, a sufficient input signal to the weighting device Gew by amplifying or damping.

In FIG. 9, an I.F. filter arrangement is shown having similar characteristics to the I.F. filter arrangement of FIG. 3, however, here the construction is selected to have parallel branches analogous with FIG. 8. This embodiment is mainly for use with digital switches. The main advantage with respect to the I.F. filter arrangement in FIG. 3 exists in that all weighting processes proceed in the basic band (useful modulation frequency) and therefore, a significant lower data rate lower dispersion, as opposed to systems in the I.F. region, are necessary. The weighting operation is carried out via the control processor Prz. With the demodulator outputs MPX1 to MPXn, outputs are made available which still enable analysis of the interferences in the neighbouring frequency regions and therefore can be taken into consideration by the control processor, for example, through reduced weighting, strong interfered demodulator outputs. It is to be seen that adjacent channel interferences are the respective outer frequency groups and that Inband interferences may be the inner lying groups. As an alternative to the version as shown, the tapping of the MPX1 to MPXn signals is carried out directly after the demodulators Dem, however, the tapping can also take place after the low pass filters Tp1 to Tpn which follow, by which the reduced data rate is further guaranteed and may even be further reduced. On the basis of the varying signal transit times in the different branches, a delay device Del 1 to Del n is provided in each branch for branching out the time differences and furthermore gives the control processor Prz the time to carry out the evaluation of the MPX signals and to appropriately control the weighting device Gew.

I claim:

1. An I.F. filter arrangement for FM receiver signals having a filter device, an FM demodulator (Dem), a low pass filter (TP) and a weighting device (Gew) which couples the output signals of the filter device with one another dependent on a demodulated FM signal, whereby the filter device comprises defined bandpass regions which show a plurality of center frequencies (F1, F2) staggered with respect to one another or have a plurality of I.F. frequencies staggered with respect to one another at the same center frequency wherein the weighting device is so disposed that signals of the filter device are fed to the weighting device while an intermediate switching of respectively the FM demodulator (Dem) or the low-pass filter (TP) is carried out for the output signals.

2. An I.F. filter arrangement according to claim 1, characterized in that a phase correcting device is provided which guarantees a phase correct coupling.

3. An I.F. filter arrangement according to claim 1, characterized in that the defined bandpass regions are formed so as to be adjustable.

4. An I.F. filter arrangement according to claim 1 characterized in that the defined bandpass regions are fixedly adjusted.

5. An I.F. filter arrangement according to claim 1, characterized in that the weighting device (Gew) is constructed as a bipolar mixer (GZ).

6. An I.F. filter arrangement according to claim 1, characterized in that a regulating amplifier (RV) is provided which strengthens or dampens the demodulated FM signal for the weighting device to a defined value.

7. An I.F. filter arrangement according to claim 1, characterized in that the tapping point of the demodulated FM signal is located behind the weighting device.

8. An I.F. filter arrangement according to claim 1, characterized in that the tapping point of the demodulated FM signal is located before the weighting device.

9. An I.F. filter arrangement claim 1, characterized in that the tapping point of the demodulated FM signal which has passed through the low-pass filter is located before the weighting device.

10. An I.F. filter arrangement according to claim 1, characterized in that the weighting device (Gew) has a plurality of individual weighting devices (Gew) formed as a cascading arrangement.

11. An I.F. filter arrangement according to claim 1, characterized in that a delay device (Del), a center frequency tracking I.F. filter (Fis), a control device (Stg) and a demodulator (Dem) are provided in a second I.F. network, whereby the delayed input signal of the I.F. filter arrangement having passed through the delay device (Del) is fed to the I.F. filter (Fis) at the same time as the end signal MPX1 of the first I.F. branch which has passed through the control device (Stg), and the output signal of the I.F. filter is then demodulated to a further end signal MPX2.

12. An I.F. filter arrangement according to claim 1, characterized in that the weighting device (Gew) is constructed as a parallel arrangement having a plurality of individual weighting devices (Gew) and having a final summing-up operation.

13. An I.F. filter arrangement according to claim 3, characterized in that a quality evaluator is provided by means of which the adjustable bandpass regions are adjusted to the respective requirements.

14. An I.F. filter arrangement according to claim 1, characterized in that the arrangement is constructed as a digital switch.

15. An I.F. filter arrangement according to claim 1 characterized in that weighting device (Gew) is constructed as a cascading structure of individual weighting devices (Gew).

16. An I.F. filter arrangement for FM receiver signals having a filter device, an FM demodulator (Dem), a low pass filter (TP) and a weighting device (Gew) which couples the output signals of the filter device with one another dependent on the demodulated FM signal, whereby the filter device comprises defined bandpass regions which show a plurality of center frequencies (F1, F2) staggered with respect to one another or have a plurality of I.F. frequencies staggered with respect to one another at the same center frequency characterized in that the tapping point of the demodulated FM signal is located before the weighting device.

17. An I.F. filter arrangement for FM receiver signals having a filter device, an FM demodulator (Dem), a low pass filter (TP) and a weighting device (Gew) which couples the output signals of the filter device with one another dependent on the demodulated FM signal, whereby the filter device comprises defined bandpass regions which show a plurality of center frequencies (F1, F2) staggered with respect to one another or have a plurality of I.F. frequencies staggered with respect to one another at the same center frequency characterized in that the weighting device (Gew) has a plurality of individual weighting devices (Gew) formed as a cascading arrangement.

* * * * *